United States Patent [19]
Weixel

[11] Patent Number: 6,037,659
[45] Date of Patent: Mar. 14, 2000

[54] COMPOSITE THERMAL INTERFACE PAD

[75] Inventor: Mark Weixel, Roseville, Calif.

[73] Assignee: Hewlett-Packard Company, Palo Alto, Calif.

[21] Appl. No.: 08/847,860

[22] Filed: Apr. 28, 1997

[51] Int. Cl.⁷ .............................. H01L 23/42; H01L 23/34
[52] U.S. Cl. ............................................. 257/717; 257/706
[58] Field of Search ................................... 257/720, 746, 257/747, 717, 786; 361/700, 708

[56] References Cited

U.S. PATENT DOCUMENTS

| | | | |
|---|---|---|---|
| 4,000,509 | 12/1976 | Jarvela | 257/697 |
| 5,184,211 | 2/1993 | Fox | 257/706 |
| 5,223,747 | 6/1993 | Tschulena | 257/713 |
| 5,387,554 | 2/1995 | Liang | 437/209 |
| 5,552,637 | 9/1996 | Yamagata | 257/717 |
| 5,604,978 | 2/1997 | Sherif et al. | 29/840 |
| 5,672,548 | 9/1997 | Culnane et al. | 257/720 |

FOREIGN PATENT DOCUMENTS

| | | |
|---|---|---|
| 0340959 | 11/1989 | European Pat. Off. . |
| 0363687 | 4/1990 | European Pat. Off. . |
| 0461753 | 12/1991 | European Pat. Off. . |
| 3116859 | 5/1991 | Japan ................................ 257/717 |
| WO 97/50124 | 12/1997 | WIPO . |

OTHER PUBLICATIONS

"Thermally Enhanced Tape Automated Bonded Package." IBM Technical Disclosure Bulletin, vol. 31, No. 5, Oct. 1998, pp. 34–35, XP002085961, New York.

*Primary Examiner*—John Guay
*Attorney, Agent, or Firm*—David A. Plettner

[57] ABSTRACT

A composite thermal interface pad is comprised of a template portion formed from a material such as thermal gap pad material or thermal tape, in which cavities have been formed and filled with a pliable non-resilient material, such as thermal grease or thermal putty. The spacing and size of the cavities may be tailored to achieve desired elastic properties and stress distributions, as well as optimize the thermal characteristics of the thermal interface with respect to heat distribution patterns of electronic components being cooled. The composite thermal interface pad may also be used to provide EMI shielding along the gap formed between the electronic component and the adjacent cooling structure by filling closely adjacent cavities with electrically conductive non-resilient material. In one embodiment, an adjacent structure is provided with projection features that dig into the non-resilient material, thereby ensuring a good thermal interface, increasing the surface area available for thermal transfer, and minimizing the distance between the electronic component and the adjacent structure used for cooling.

3 Claims, 14 Drawing Sheets

COMPOSITE THERMAL INTERFACE PAD

FIELD OF THE INVENTION

The present invention relates to a thermal interface that helps to transfer heat from a heat producing component, such as an integrated circuit (IC), to a heat dissipating component, such as a heat sink or adjacent structure. More specifically, the present invention relates to a composite thermal interface comprised of a template, formed from material such as gap pad material or thermal tape, having cavities filled with a pliable material, such as thermal grease or thermal putty.

DESCRIPTION OF THE RELATED ART

Electronic components, such as integrated circuits (ICs), can generate considerable heat. There are two primary thermal conduction paths that may be used to remove heat from electronic components; via the solder connections from the component into the underlying printed circuit board (PCB) and via the top surface of an electronic component. To date, most solutions have focused on removing heat from the top surface of an electronic component.

A common method used to maintain electronic components at acceptable operating temperatures is to position a planar surface of the electronic component in contact with a planar surface of a heat removal device, such as a heat sink. However, this alone does not provide an adequate thermal interface because when two such surfaces are brought together, less than one percent of the surfaces make physical contact. As much as 99% of the surfaces are separated by a layer of interstitial air. Some heat is transferred at the points of contact, but much of the heat has to travel through the interstitial air gaps. The total thermal resistance through a thermal interface is the thermal resistance at the thermal interface surface of the electronic component, the thermal resistance at the thermal interface of the heat removal device, and the thermal resistance of the material in the interstitial gaps.

Air is a poor thermal conductor and has a thermal conductivity of 0.027 W/m° C. It is known in the art to use an interface material to fill the interstitial gaps. One of the best classes of interface materials are thermal greases. Thermal greases are made be dispersing thermally conductive ceramic fillers in silicone or hydrocarbon oils to form a paste, and have a thermal conductivity of approximately 3 W/m° C. Ideally, thermal grease is applied to one or both surfaces, and the surfaces are held together by a moderate amount of pressure. For example, it is common to use a spring clip to hold a heat sink to an integrated circuit, with thermal grease between the integrated circuit and the heat sink. Thermal greases are pliable, non-resilient, and do not retain or return to their original shape after being deformed.

While thermal grease works well, it has drawbacks. It is messy to apply, and over time it can dry out and lose thermal conductivity. Thermal putty, such as the T-putty 500 series of thermally conductive putties manufactured by Thermagon, Incorporated, is somewhat similar to thermal grease, but has several advantages. For example, T-putty 502 has a relatively high thermal conductivity of 4 W/m° C. and is a soft, pliable, and non-resilient paste-type material that is designed to transfer heat between parts of a delicate nature where only minimal pressure can be applied. Thermal putty is available in sheets of various thicknesses, and is much less messy to work with than thermal grease. Like thermal grease, thermal putty does not retain or return to its original shape after being deformed.

In general, materials that are electrically conductive are also thermally conductive. For example, metals are typically more thermally conductive than plastics. Accordingly, many electrically conductive materials could also be formed into excellent thermal interface materials. However, such thermal interface materials could cause problems if the material were to reach a PCB and short out two or more electrical conductors, especially if the material is messy to work with, such as thermal grease. To avoid this problem, most thermal interface materials have relatively high electrical resistances, even though such high resistances necessitate lower thermal conductivities.

Another class of interface materials are represented by gap pads and thermal tape. Gap pads are formed from resilient highly-conformable thermally conductive materials. Gap pads return to their original shape after a deflecting force has been removed. An example is Gap Pad V0, with is manufactured by the Bergquist Company. While gap pads are much more thermally conductive than air, they are not as thermally conductive as thermal greases or putties. For example, Gap Pad V0 has a thermal conductivity of 0.80 W/m° C. @ 10 psi.

Another disadvantage of gap pads is that pressure is required to achieve acceptable thermal conduction values. Pressure is required both to force the gap pad material into the interstitial gaps, and compress the gap pad itself to minimize the distance between the electronic component and heat removal device. Pressure is much less critical when using thermal greases or putties as an interface material, because these materials naturally flow into the interstitial gaps, and their non-resilient pliable qualities prevents them from pulling out of the gaps after pressure is removed.

Thermal tapes are similar to, but typically much thinner than gap pads and are generally used for transferring heat between a single IC and a single heat sink. They are also non-compressible. Therefore, like gap pads, thermal tapes have a defined shape.

The greatest advantage of gap pads and thermal tapes is their ease of use when fabricating and assembling electronic devices. Gap pads and thermal tapes are available with one or both surfaces coated with an adhesive substance or a tacky substance. A tacky substance is ideal when it is desirable to hold a gap pad in position while assembling electronic components, while an adhesive substance is used when the gap pad itself is used to mount a heat sink to an electronic component.

For example, FIG. 1 shows prior art circuit assembly 10. Assembly 10 includes a PCB 12, IC 14, heat sink 16, and gap pad 18. Gap pad 18 provides a thermal interface between integrated circuit 14 and heat sink 16. A typical thickness for a gap pad between a single heat sink and a single integrated circuit is 0.025 inches. For illustrative purposes, gap pad 18 is not drawn to scale in FIG. 1.

When there is a need to cool more than one integrated circuit, it is common to use an adjacent structure to cool multiple integrated circuits, or to encapsulate an entire PCB within a thermal can. Often a designer will choose to encapsulate a PCB to contain electro-magnetic interference (EMI) emissions, so it may also be convenient and economical to also use the same structure to remove heat from integrated circuits.

FIG. 2 is a prior art circuit assembly 20 that incorporates a thermal can. Assembly 20 includes PCB 22, ICs 24 and 26, and thermal can 28. Thermal can 28 includes bosses 34 and 36. Gap pad 30 provides a thermal interface between boss 34 and IC 24. Likewise, gap pad 32 provides a thermal interface between boss 36 and IC 26. To provide total EMI containment, a second thermal can may be provided along the bottom side of PCB 22. In other configurations, a PCB may have components on both sides, in which case the components and thermal can adjacent the bottom of the PCB would be similar to the components and thermal can adjacent the top of the PCB. For illustrative purposes, gap pads 30 and 32 are not drawn to scale in FIG. 2.

An important factor to consider when using a thermal can is the stack-up tolerances of each element in a stack. For example, there are two stacks in FIG. 2, the stack formed by PCB 22, IC 24, gap pad 30, and boss 34 and the stack formed by PCB 22, IC 26, gap pad 32, and boss 36. The tolerances that must be considered when calculating the total stack-up tolerance are the tolerances associated with the PCB thickness, the height of the electronic component (including variations in height introduced by assembly), the interface pad thickness, thickness of the thermal can and boss, the PCB warpage, and the planarity of the boss surface, the electronic component surface, and surfaces of the gap pad. In addition, a significant variation can result from the substitution of one manufacturer's component with a component from another manufacturer, where the two components are not the same height. All these tolerances (as well as height variations of components from different manufacturers) must be controlled if an adequate thermal interface is to be formed between a plurality of electronic components and a single thermal can. Of course, these tolerances need not be considered when attaching a single heat sink directly to a single electronic component.

In the prior art, there are two primary methods for addressing circuit assemblies that have significant stack-up tolerances. The first method is to use a pliable and non-resilient thermal compound such as thermal grease or thermal putty. These compounds have good thermal conductivity and will conform easily to various tolerance stack-ups. However, since these compounds are non-resilient, and once deformed they will not return to their original shape. This is a critical factor because the thermal expansion and contraction associated with the heating and cooling cycles that occur whenever a device is powered on and then powered off will eventually cause the thermal compound to lose contact with either the electronic component or the boss, thereby degrading the thermal interface. An additional problem related to pliable and non-resilient thermal compounds is the difficulty in controlling their shape when performing initial assembly or rework.

Resilient, conformable materials, such as gap pads, solve some of these problems. Since such materials are resilient, they adapt well to heating and cooling cycles because they attempt to return to their original uncompressed shape. In addition they are easy to work and shape during initial assembly or rework. The major problem associated with resilient, conformable materials, such as gap pads, is that a certain amount of pressure is required at each electronic component to overcome stack-up tolerances and fill interstitial gaps, and the required pressure may generate excessive forces on the electronic components and PCB. Of course, this problem becomes worse as the number of electronic components cooled by a single thermal can increases. The excessive forces are sometimes reduced by machining relieves into the bosses of the thermal can. However, this reduces thermal performance and adds extra manufacturing costs.

Other problems associated with resilient, conformable materials, such as gap pads, are that they do not have good thermal conductivity values compared to thermal putties and greases, and large stack-up tolerances may generate excessive forces that cause the elastic limit of the gap pad material to be exceeded, which prevents the gap pad material from returning to its original shape.

SUMMARY OF THE INVENTION

The present invention is a composite thermal interface pad comprised of a template formed from a material that does not lose its shape, such as thermal gap pad material or thermal tape, in which cavities have been formed and filled with a pliable non-resilient material that does lose its shape when deformed, such as thermal grease or thermal putty.

The spacing and size of the cavities may be tailored to achieve desired elastic properties, stress distributions, and surface interfaces. In addition, the cavities may be positioned to optimize the thermal characteristics of the thermal interface with respect to the heat distribution pattern of the electronic component that is being cooled.

A single composite interface pad may be provided with a variety of cavities filled with pliable non-resilient material to cool an array of components, such as an SDRAM array. Alternatively, a single composite interface pad having a single cavity filled with pliable non-resilient material may be provided for a single component, such as a CPU thermally coupled to a heat sink.

The present invention may also be used to provide EMI shielding along the gap formed between the electronic component and the cooling structure. By filling closely adjacent cavities with electrically conductive pliable non-resilient material, and providing electrical connectivity between the electrically conductive pliable non-resilient material and a ground path on the PCB and a ground path on the cooling structure, the present invention provides EMI shielding within the thermal interface.

In one embodiment of the present invention, an adjacent structure is provided with projection features that dig into the pliable non-resilient material. The projection features ensure a good thermal interface, increase the surface area available for thermal transfer, and minimize the distance between the electronic component and the adjacent structure used for cooling.

The present invention provides the benefits enjoyed by prior art materials having defined shapes, such as gap pads and thermal tapes, while providing thermal transfer characteristics similar to those found in prior art pliable non-resilient materials such as thermal grease and thermal putty.

DETAILED DESCRIPTION OF THE PREFERRED EMBODIMENTS

Figure 1:
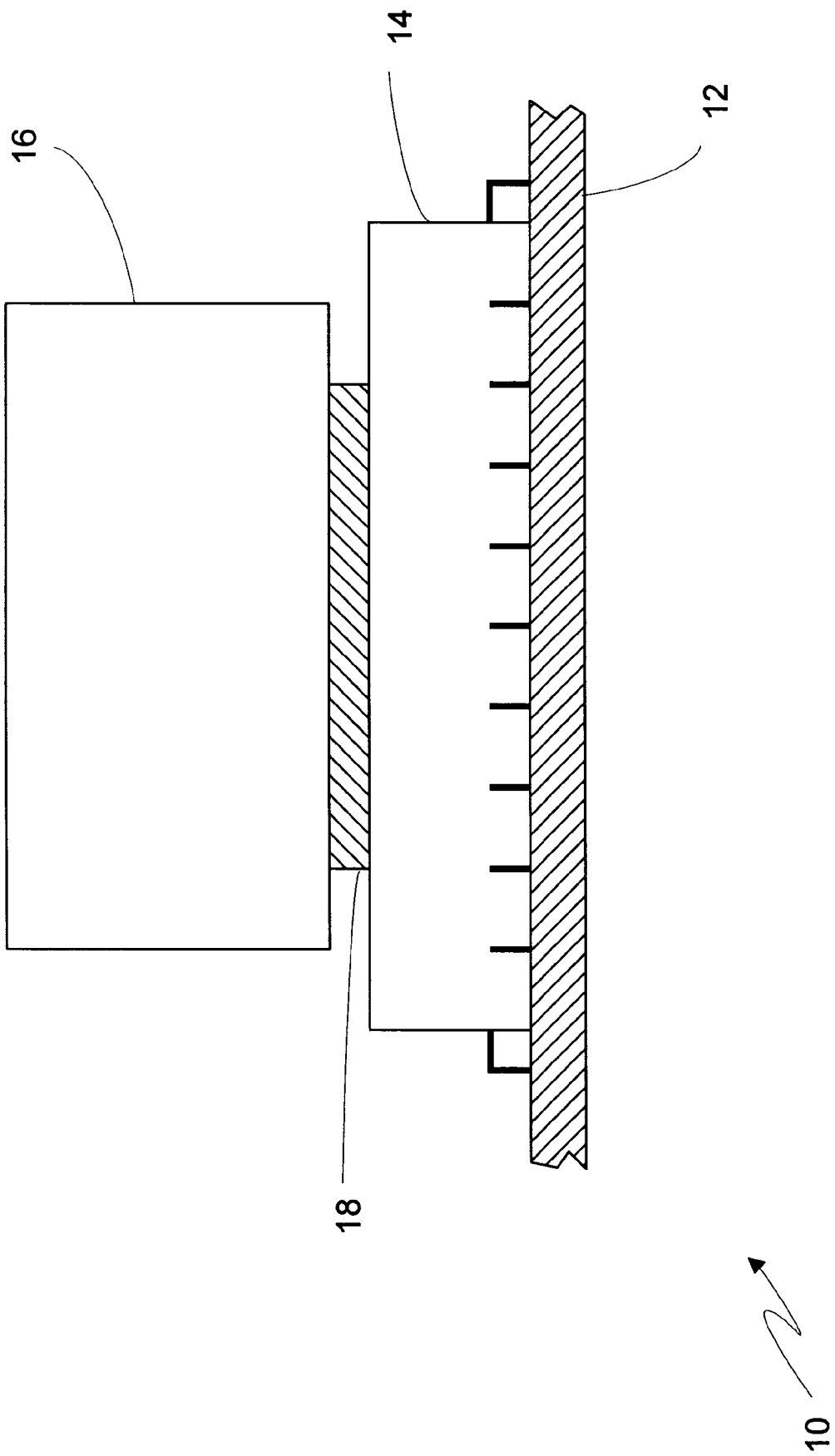
FIG. 1 shows a prior art circuit assembly having a thermal interface between an electronic component and a heat sink.
Figure 2:
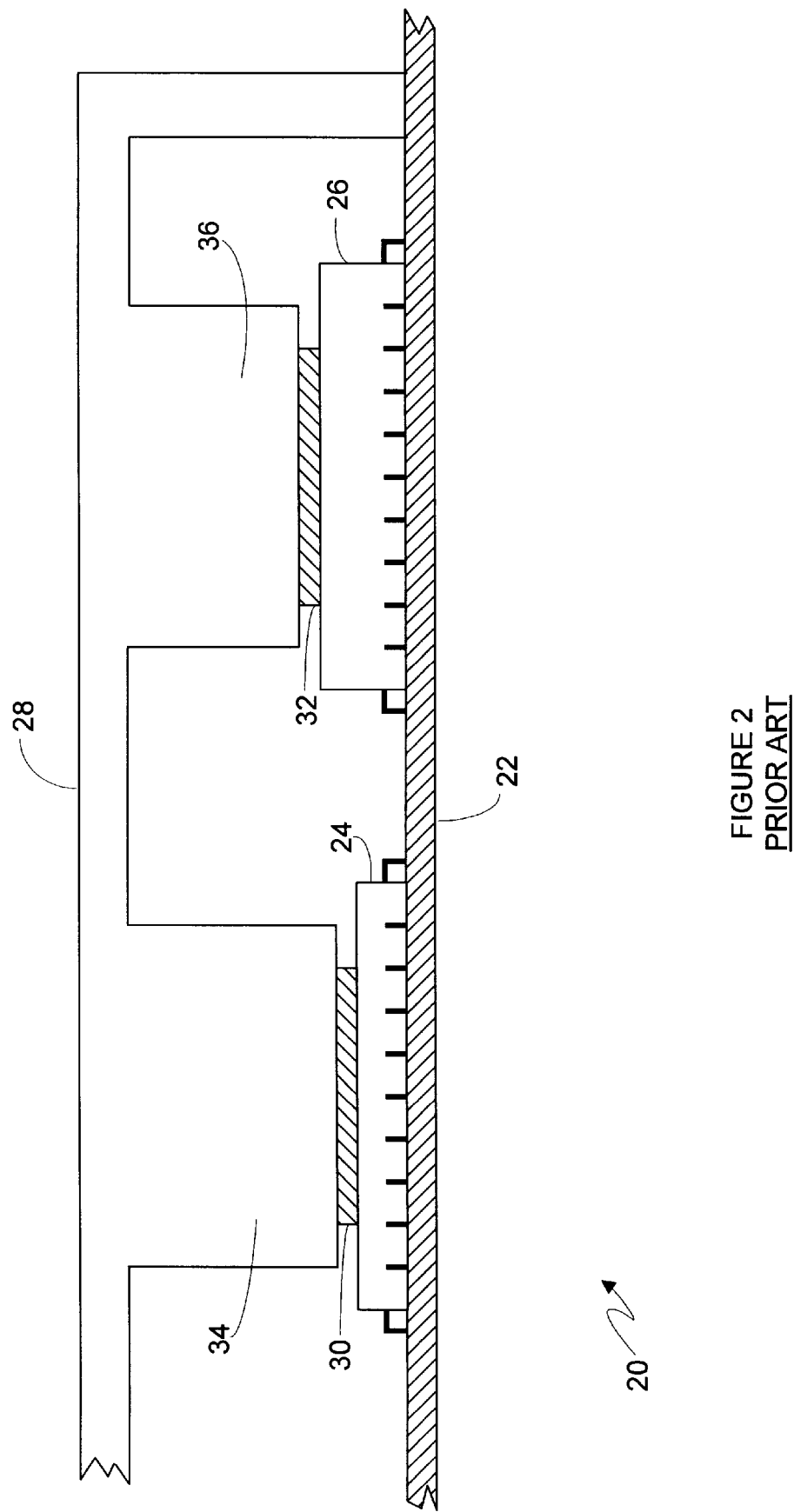
FIG. 2 is a prior art circuit assembly that has a plurality of thermal interfaces between a thermal can and corresponding plurality of electronic components.
Figure 3:
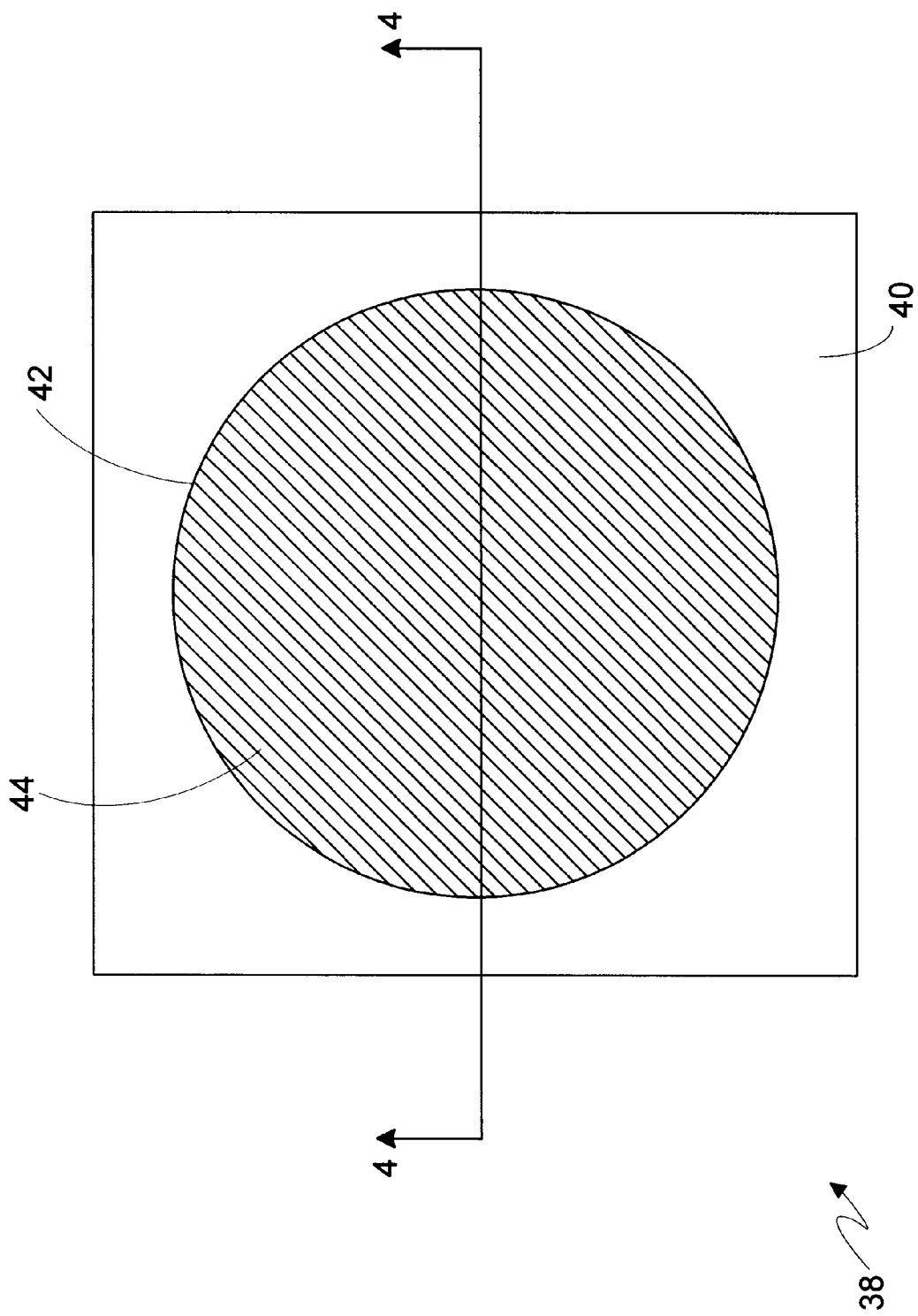
FIG. 3 shows the composite thermal pad of the present invention.

FIG. 3 shows composite thermal pad 38 of the present invention. Composite thermal interface pad 38 is comprised of a template portion 40 that includes a cavity 42 that is filled with a pliable non-resilient portion 44. In one embodiment of the present invention, the template portion of thermal interface pad 38 is formed from a resilient conformable material, such as gap pad material, and the pliable non-resilient portion is formed from thermal grease or thermal putty. In another embodiment, the template portion of thermal interface pad 38 is formed from a relatively non-resilient material having a definable shape, such as thermal tape, and the pliable non-resilient portion is formed from thermal grease or thermal putty.

Figure 4A:
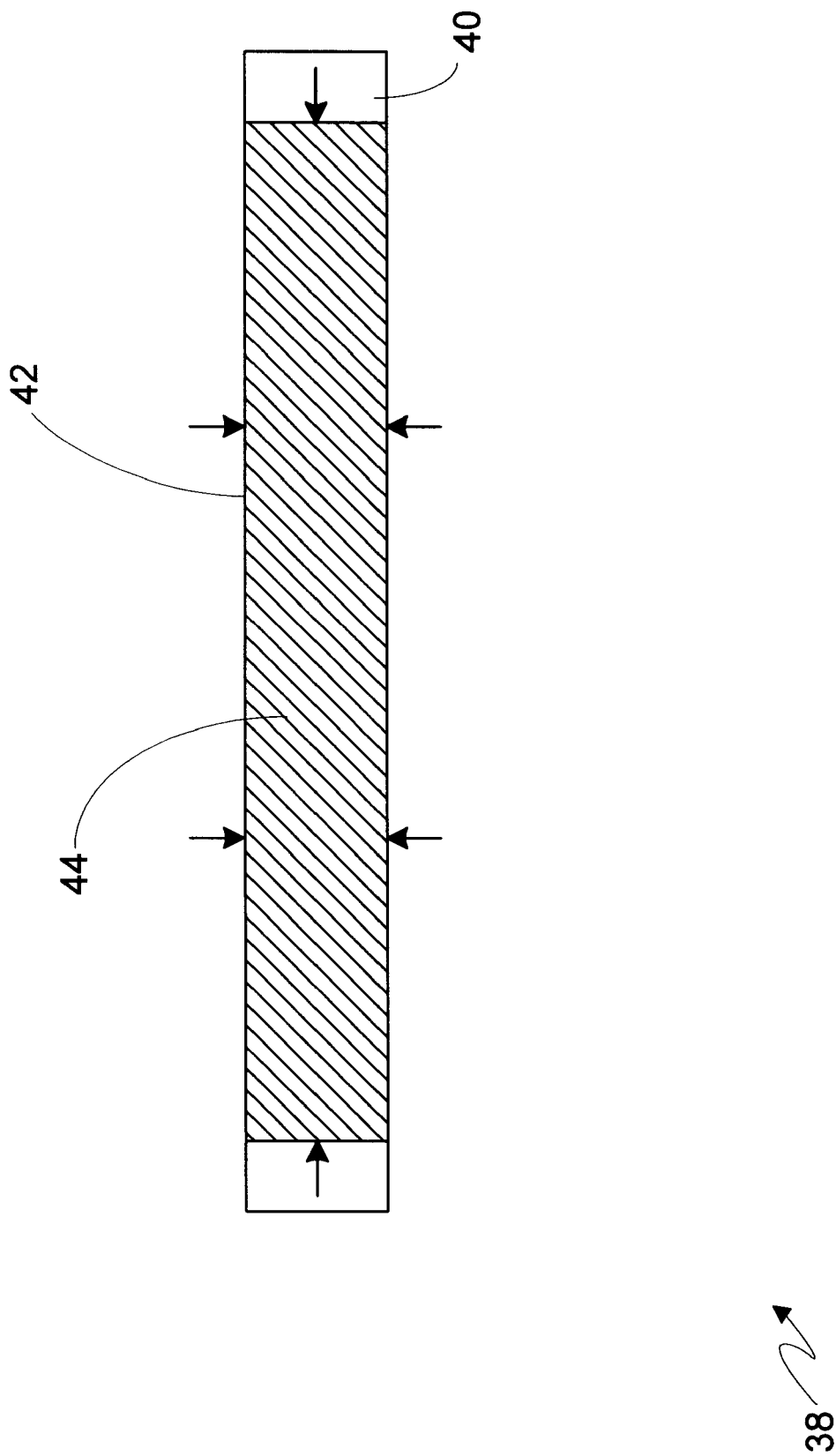
FIG. 4A is a sectional view taken along line 4—4 of FIG. 3.

FIG. 4A is a sectional view taken along line 4—4 of FIG. 3. As seen in FIGS. 3 and 4A, pliable non-resilient material 44 has the shape of a squat cylinder. Pressure is applied to pliable non-resilient material 44 from beneath by an electronic component, from above by a boss of a thermal can (or other structure), and from the sides by template portion 40. When template portion 40 is formed from a resilient material, such as gap pad material, portion 40 imparts a certain amount of resiliency to pliable non-resilient material 44. Accordingly, when thermal expansion causes a thermal can boss and top surface of a component to move closer together, the height of the cylinder of non-resilient material 44 decreases, while the diameter of the cylinder increases. As the diameter of the cylinder increases, resilient material 40 applies pressure to the sides of the cylinder. When the circuit assembly cools and thermal expansion causes the thermal can boss and top surface of the component to move farther apart, the sides of the cylinder of non-resilient material 44 are squeezed by resilient material 40 to increase the height of the cylinder while decreasing the diameter of the cylinder. Accordingly, the present invention combines the two prior art interface materials to form a composite interface pad that has the major advantages of each material, without suffering from the disadvantages associated with either material.

To form the composite thermal interface pad of the present invention, a block of material may be bored out to form the template pattern, and filled with pliable non-resilient material, after which the block may be sliced into interface pads of any desired thickness. Alternatively, cavities may be punched into the material to form the template, and pliable non-resilient material may be applied to the cavities. Of course, any other methods known in the art may be used.

Though the shape of pliable non-resilient portion 44 is circular in FIG. 3, a variety of other configurations may be used. For example, it may be desirable to provide a cavity having a central hub with a series of spokes emanating from the hub. Such a cavity will better retain the pliable non-resilient material within the template before assembly, as well as provide additional channels (and therefore surface area) within the template cavity for imparting resiliency to the pliable non-resilient material after assembly. Of course, a variety of other shapes may be used, and the invention is not limited to any particular shape.

The present invention may also be packaged in a manner similar to the manner in which gap pads and thermal tapes are packaged. For example, one or both sides of the template portion may be coated with an adhesive or tacky substance. Also, liners may be applied to one or both sides of the composite thermal interface pad to protect the adhesive or tacky layers, and to contain the pliable non-resilient material within the template portion.

Figure 4B:
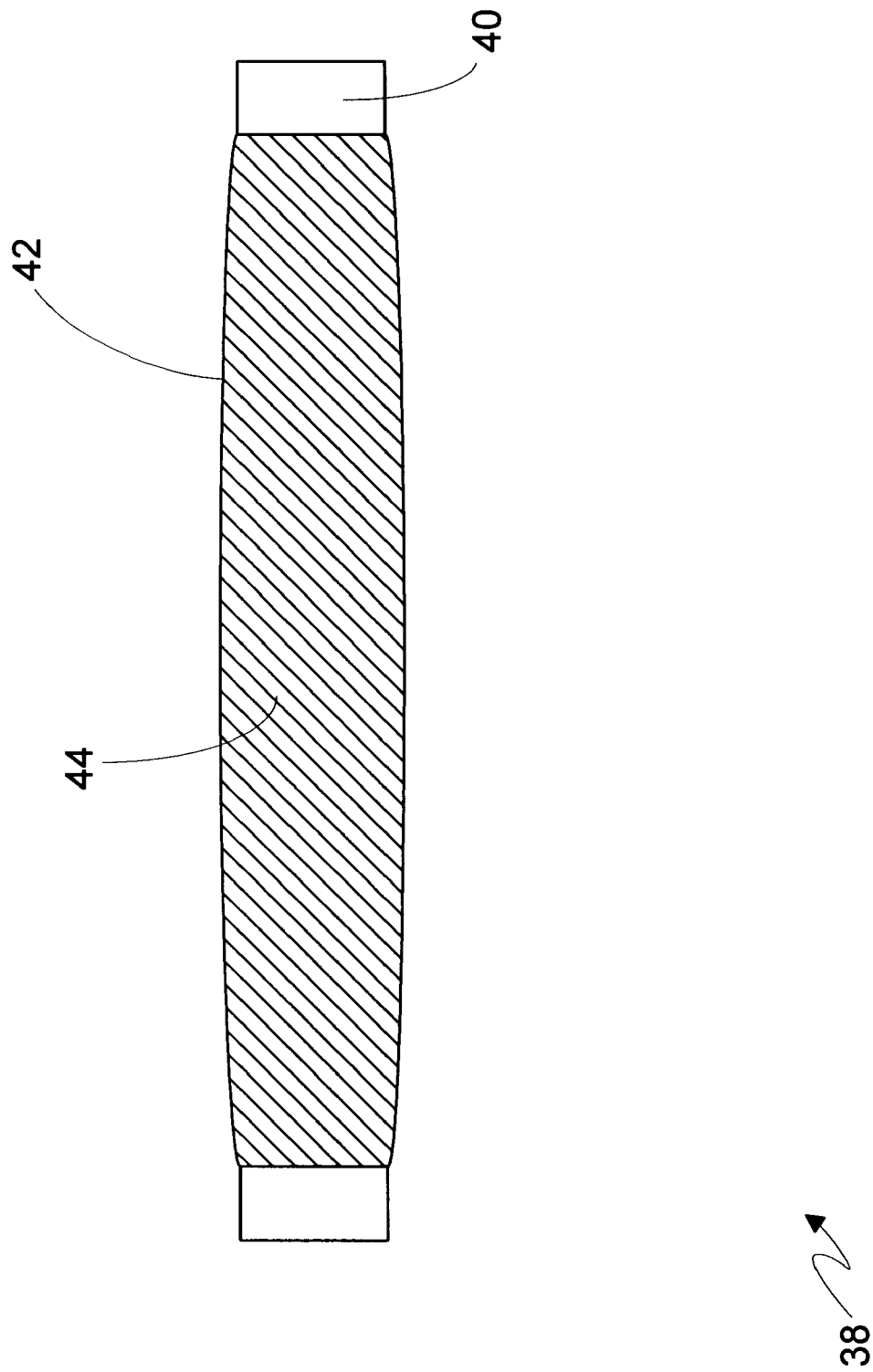
FIG. 4B shows the thermal interface pad of FIG. 3 with a cavity therein slightly "overfilled" with pliable non-resilient material.

When forming the composite thermal interface pad of the present invention, it may be desirable to "underfill" or "overfill" the cavities in the template portion. For example, FIG. 4B shows thermal interface pad 38 with cavity 42 slightly overfilled with pliable non-resilient material 44. This embodiment is useful when minimal pressure is to be applied to pad 38 because it ensures contact between the electronic component to be cooled and the structure that is conducting away heat, such as a boss on a thermal can.

Figure 4C:
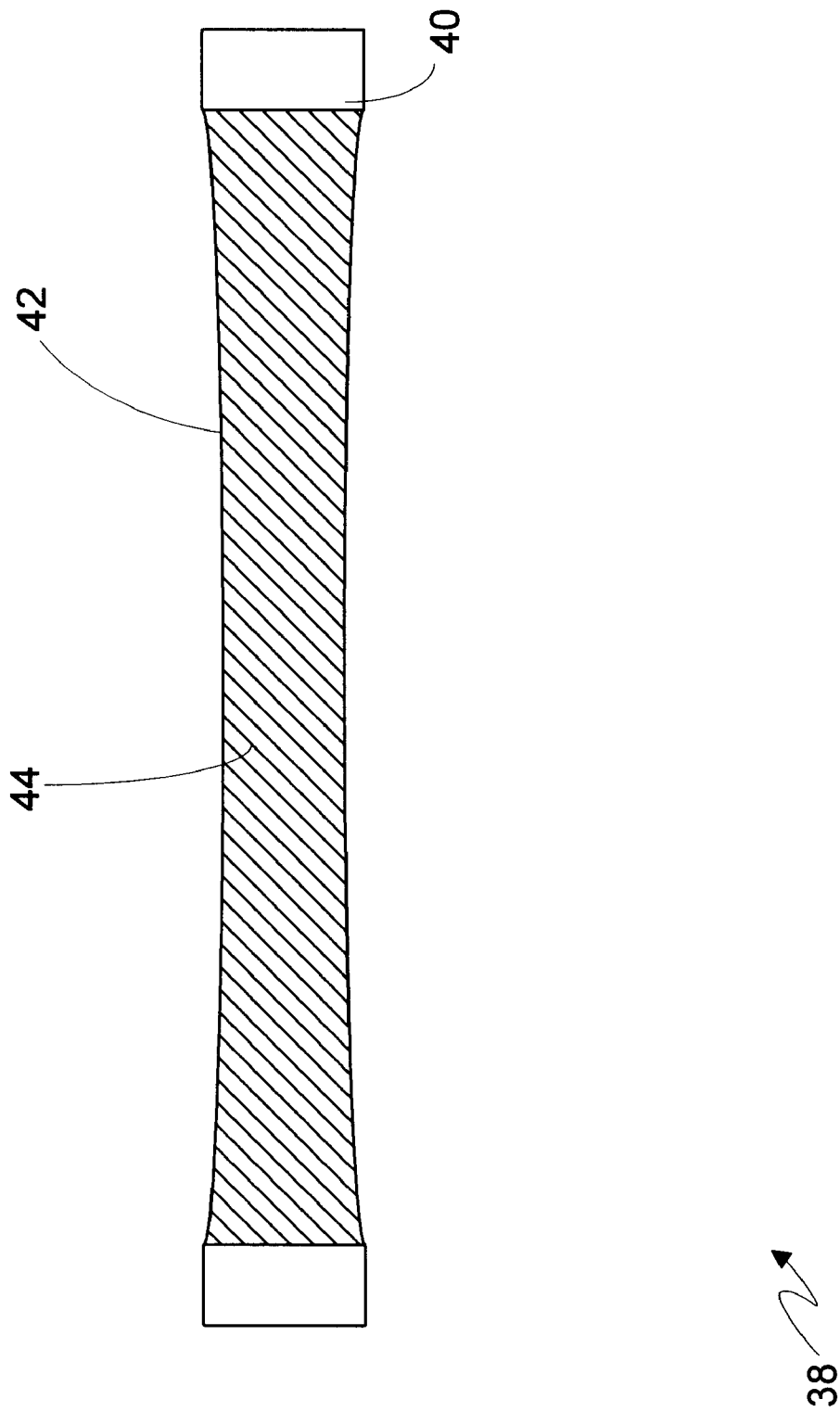
FIG. 4C shows the thermal interface pad of FIG. 3 with a cavity therein slightly "underfilled" with non-resilient material.

In contrast, FIG. 4C shows thermal interface pad 38 with cavity 42 slightly underfilled with pliable non-resilient material 44. The embodiment is useful when resilient material (such as gap pad material) will be used to form template portion 40, and will be somewhat more compressed when used in a final assembly. Since pliable non-resilient material 44 will typically be much less compressible than template portion 40 in this embodiment, underfilling cavity 42 helps maintain uniform thickness of the pad after assembly into a product. Of course, whether the cavity is filled as shown in FIGS. 4A, 4B, or 4C (or in some other manner) is a parameter that may be determined by an implementor of the present invention when the present invention is adapted for a particular environment.

Figure 5:
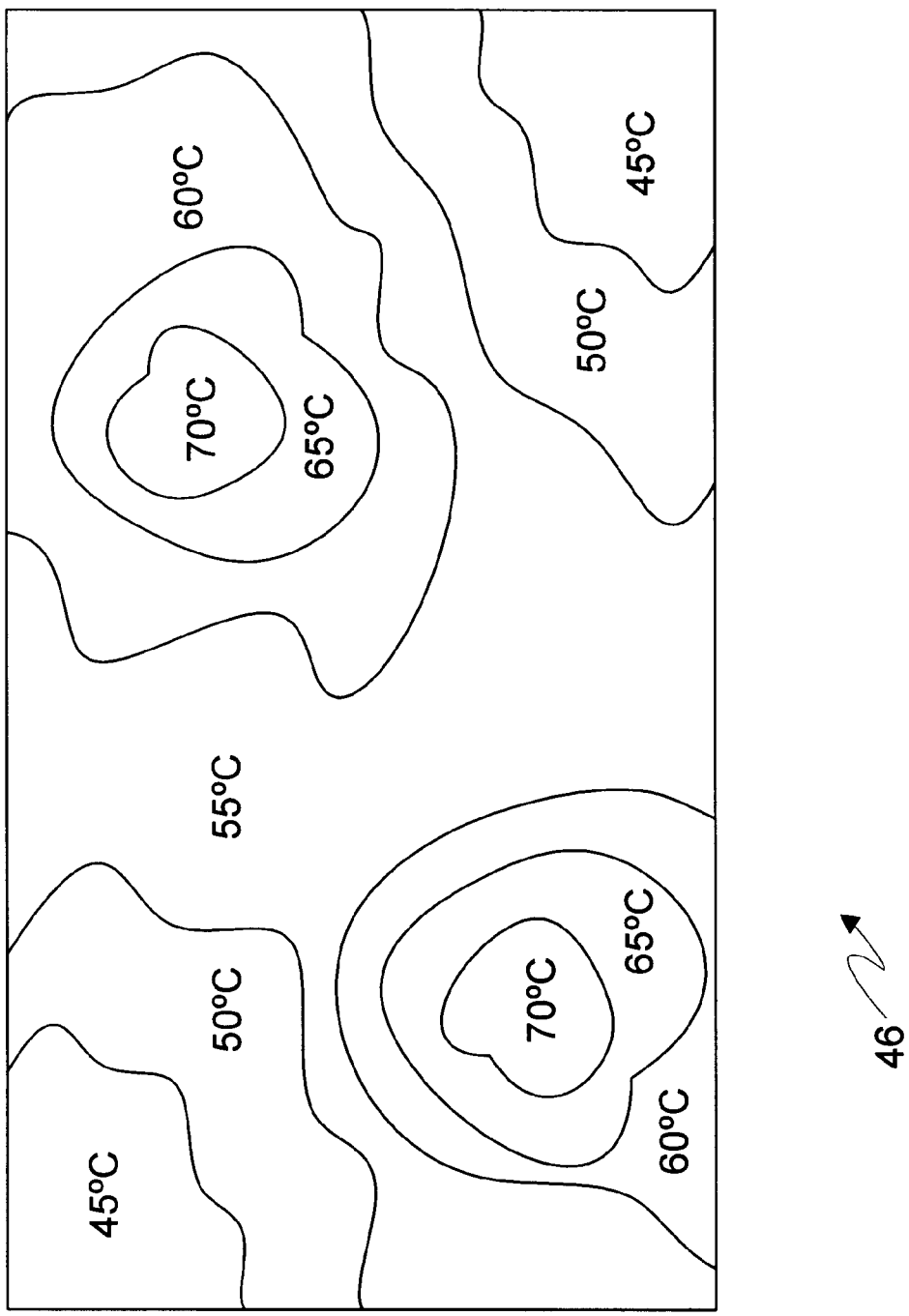
FIG. 5 shows a heat distribution map of a multi-chip module having two integrated circuits therein.

The thermal performance of the present invention can be tailored to address the heat dissipation needs of particular components. For example, FIG. 5 shows a heat distribution map 46 of a multi-chip module having two integrated circuits in a single module. Multi-chip modules in are common in the field of computing. For example, the Intel's Pentium Pro® CPU is a multi-chip module containing two integrated circuits in a single package. Such heat distribution maps are easily generated by viewing an electronic component with an infra-red camera.

Figure 6:
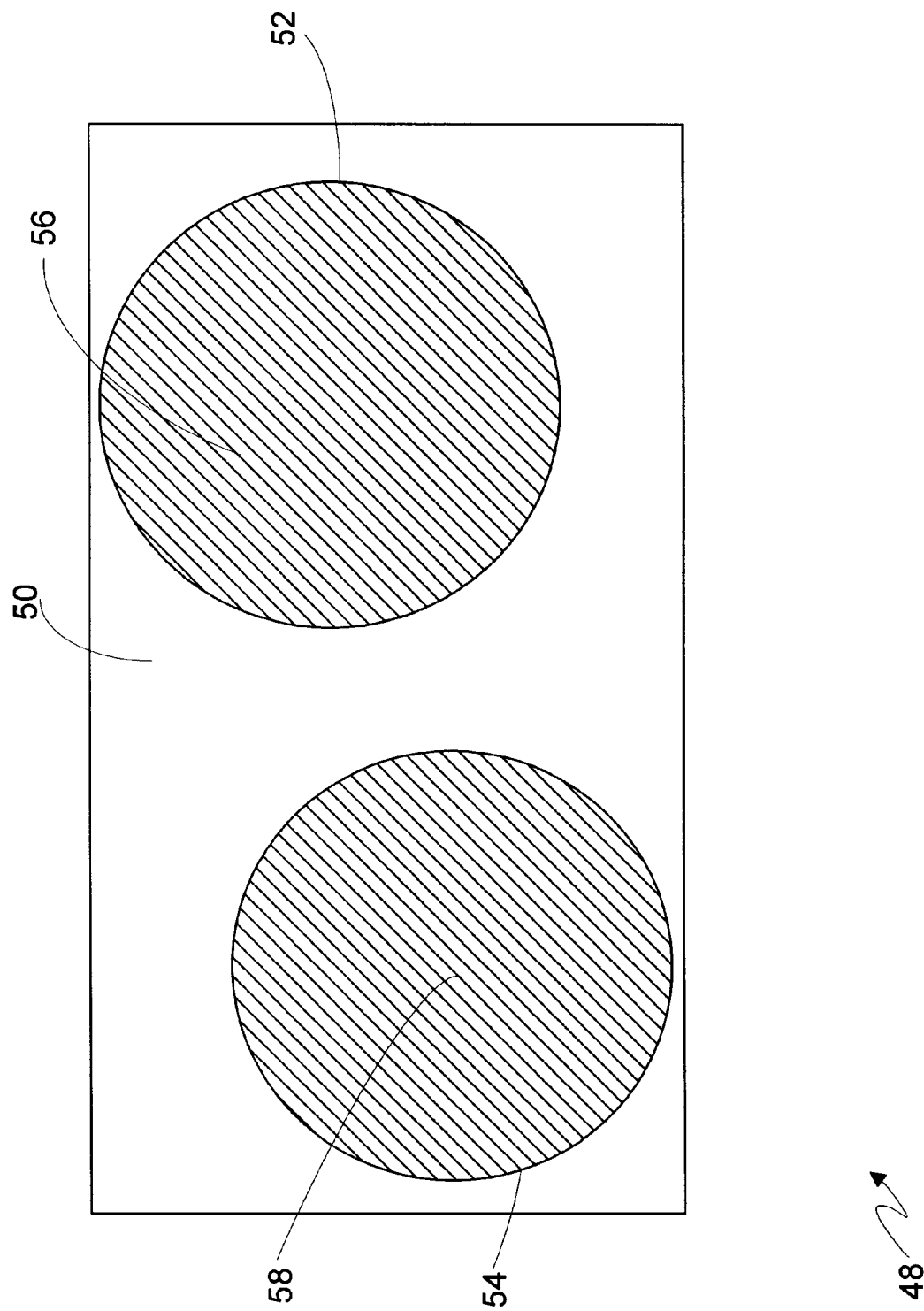
FIG. 6 shows a composite thermal interface pad in accordance with the present invention that has been tailored to match the thermal characteristics of the multi-chip module associated with the thermal distribution map of FIG. 5.

FIG. 6 shows a composite thermal interface pad 48 of the present invention that has been tailored to match the thermal characteristics of the multi-chip module associated with thermal distribution map 46 of FIG. 5. Interface pad 48 is formed from template portion 50 and pliable non-resilient portions 56 and 58. Pliable non-resilient portions 56 and 58 are positioned within cavities 52 and 54 of template portion 50. Note that pliable non-resilient portions 56 and 58 are positioned over the hottest portions of the multi-chip module, as shown in thermal map 46 of FIG. 5.

Figure 7:
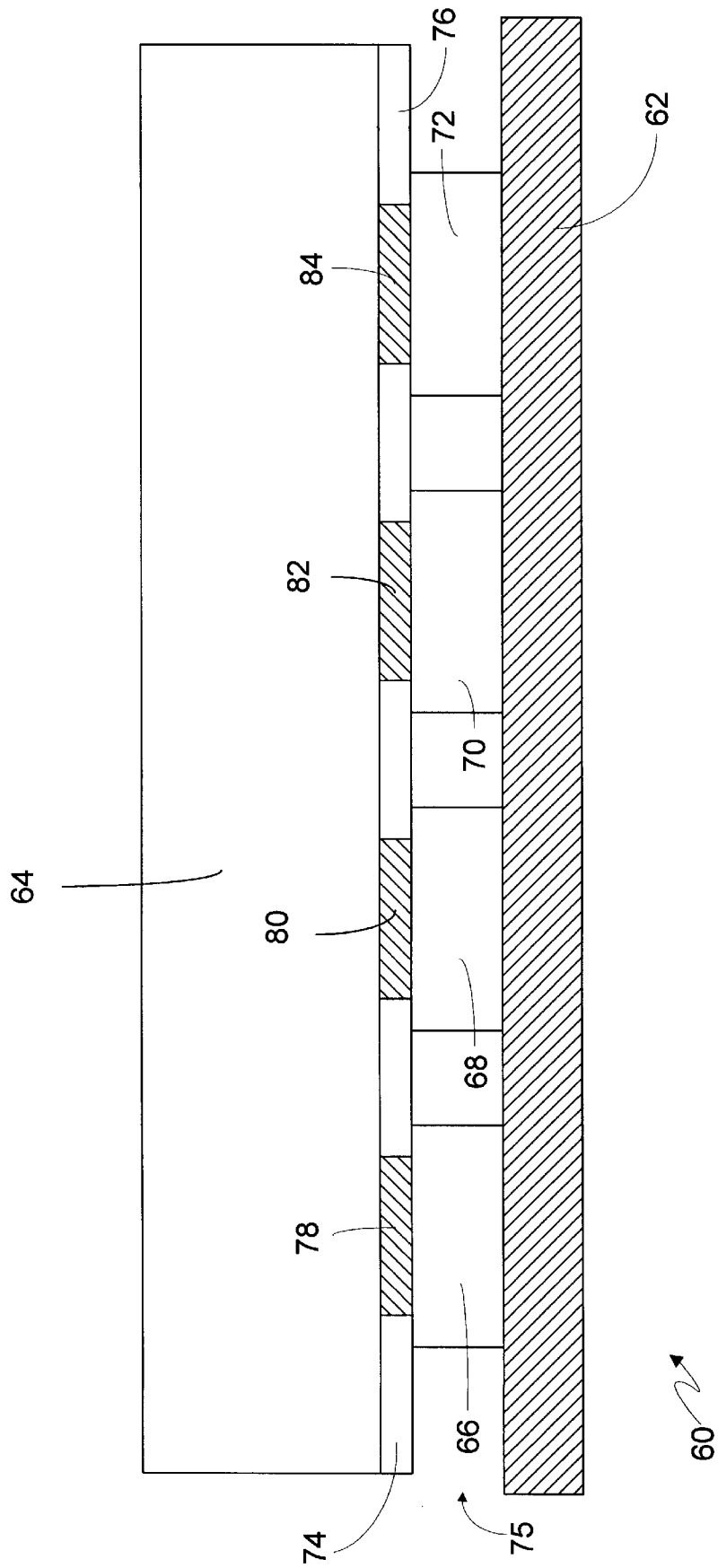
FIG. 7 shows a circuit assembly that illustrates another embodiment of the present invention wherein a single composite thermal interface pad provides a thermal interface for a series of electronic components.

FIG. 7 shows a circuit assembly 60 that illustrates another embodiment of the present invention. Assembly 60 includes PCB 62, thermally conductive adjacent structure 64, electronic components 66, 68, 70, and 72, and composite thermal interface pad 74. Composite thermal interface pad 74 includes a single template portion 76, and pliable non-resilient portions 78, 80, 82 and 84, which are positioned above electronic components 66, 68, 70, and 72, respectively.

Figure 8:
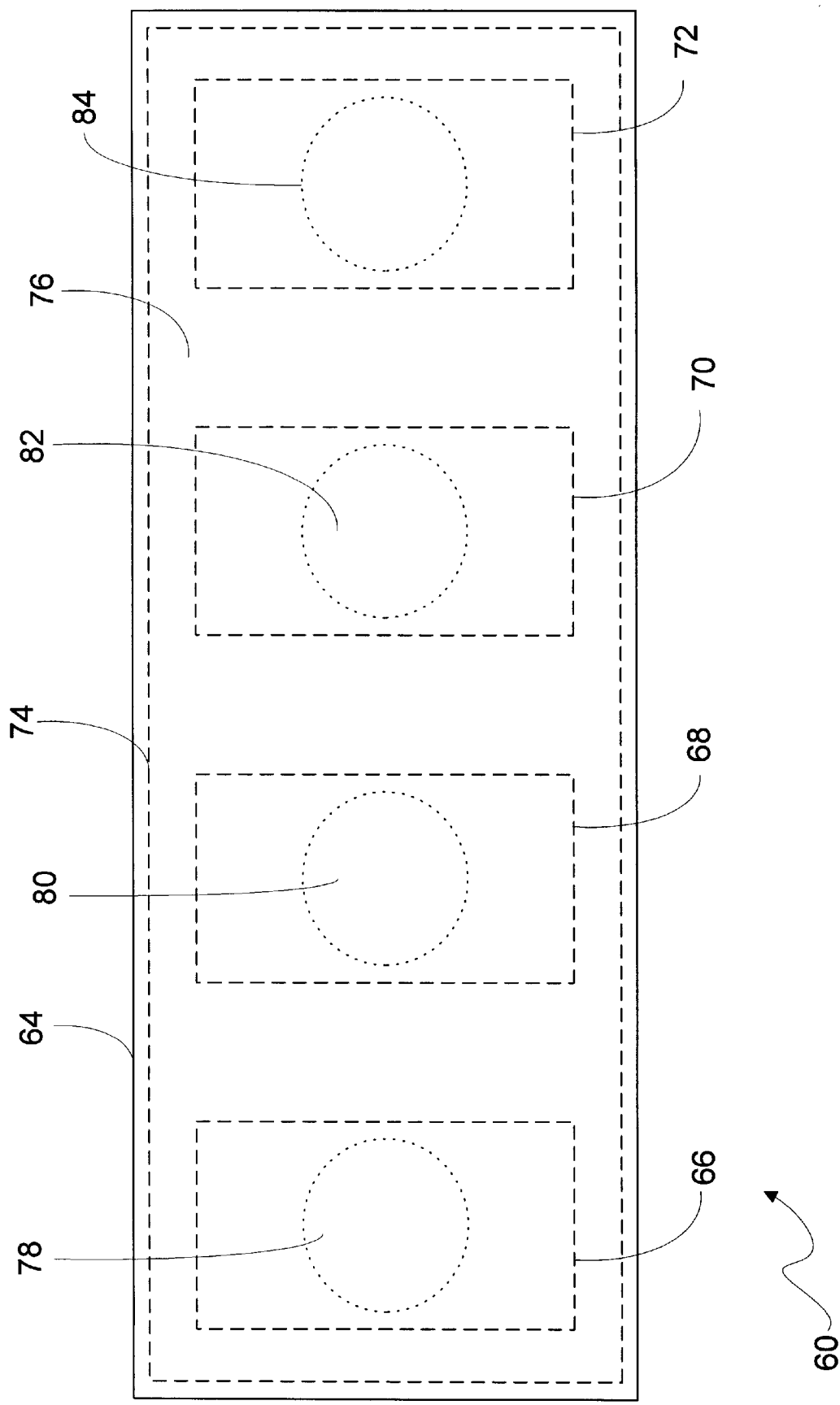
FIG. 8 is a top view of the assembly of FIG. 7.

FIG. 8 is a top view of assembly 60 of FIG. 7. As in FIG. 8, thermally conductive adjacent structure 64 is above composite thermal pad 74, which in turn is above electronic components 66, 68, 70, and 72. Composite thermal interface pad 74 has a single template portion 76, and pliable non-resilient portions 78, 80, 82, and 84, with each pliable non-resilient portion centered above an electronic component. The embodiment of the present invention shown in FIGS. 7 and 8 is ideally suited for high density groupings of electronic components, such as an array of SDRAM devices.

The present invention also provides a unique opportunity to enhance electro-magnetic interference shielding (EMI) in the gap area between 4 PCB and an adjacent structure, such as a thermal can or heat sink. In FIG. 7, note gap 75 between PCB 62 and adjacent structure 64. EMI from components 66, 68, 70, and 72 may escape via gap 75, even though EMI is otherwise contained by structure 64 and a ground layer of PCB 62 (or some other structure not shown in FIG. 7).

Figure 9:
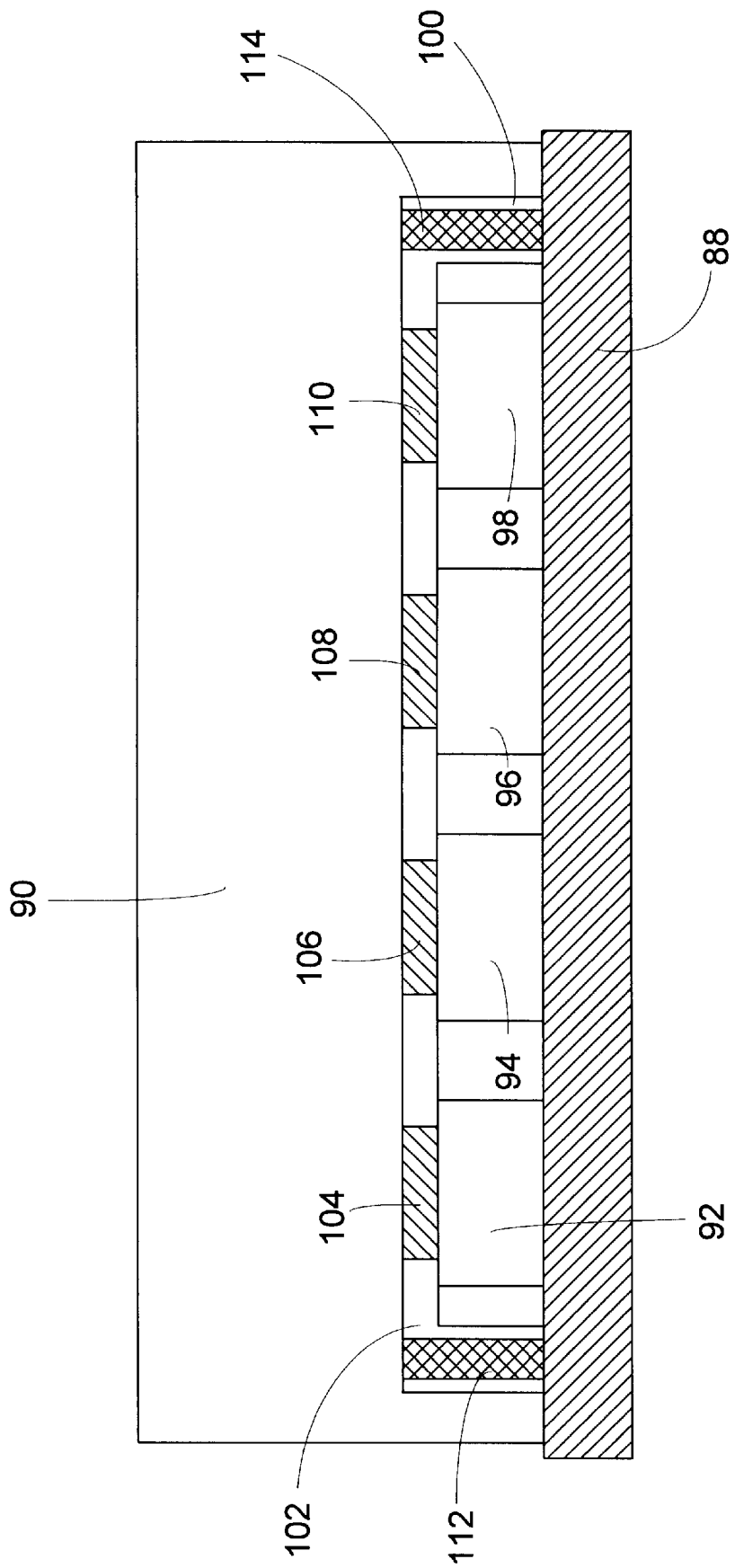
FIG. 9 shows a circuit assembly that illustrates an embodiment of the invention in which the gap between an adjacent structure and a printed circuit board is shielded.

FIG. 9 shows a circuit assembly 86 that illustrates an embodiment of the invention in which the gap between an adjacent structure and a PCB is shielded. Assembly 86 includes PCB 88, thermally conductive adjacent structure 90, electronic components 92, 94, 96, and 98, and composite thermal interface pad 100. Composite thermal interface pad 100 includes a single template portion 102, and pliable non-resilient material portions 104, 106, 108 and 1 10, which are positioned above electronic components 92, 94, 96, and 98, respectively. In addition, pad 100 includes a series of pliable non-resilient electrically conductive portions, such as portions 112 and 114. In the area of portions 112 and 114, template portion 102 is extended to bridge the gap between adjacent structure 90 and PCB board 88. In addition, pliable non-resilient electrically conductive material portions 112 and 114 are in electrical contact with adjacent structure 90 and a conductive layer of PCB 88.

Figure 10:
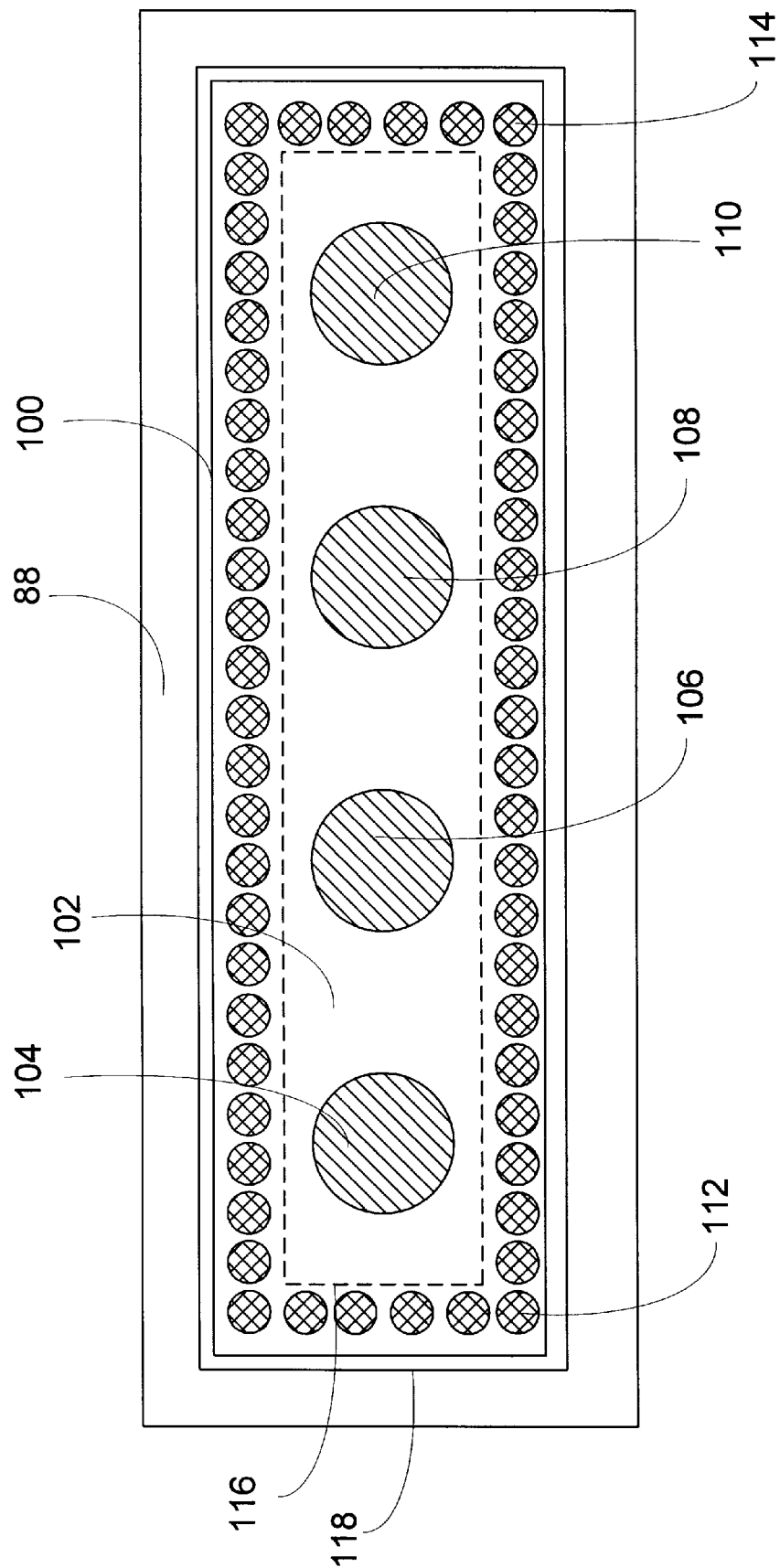
FIG. 10 shows a top view of a composite thermal interface pad and a printed circuit from the circuit assembly of FIG. 9.

FIG. 10 shows composite thermal interface pad 100 above PCB 88. As seen in FIG. 9, pad 100 includes a single template portion 102, and pliable non-resilient portions 104, 106, 108 and 1 10. Pliable non-resilient electrically conductive material portions 112 and 114, which are visible in FIG. 9, are members of a series of pliable non-resilient electrically conductive portions positioned proximate the outer edge of pad 100. The pliable non-resilient electrically conductive portions also provide good thermal conductivity.

PCB 88 includes a ground strip that is bounded by dotted line 116 and solid line 118. The ground strip may be provided by a foil conductor on PCB 88 and is in electrical contact with each of the pliable non-resilient electrically conductive material portions. As discussed above, the pliable non-resilient electrically conductive material portions are also in electrical contact with adjacent structure 90, which is shown in FIG. 9.

It is generally understood in the art of EMI containment that a shield having gaps of 0.1 inches or less provides acceptable shielding for high-speed electronic systems, such as computer systems. Therefore, the pliable non-resilient electrically conductive material portions of composite thermal interface pad 100 are no more than 0.1 inches apart. Of course, those skilled in the art will recognize that the gap spacing may be adapted based on the environment in which the present invention will be used.

Figure 11:
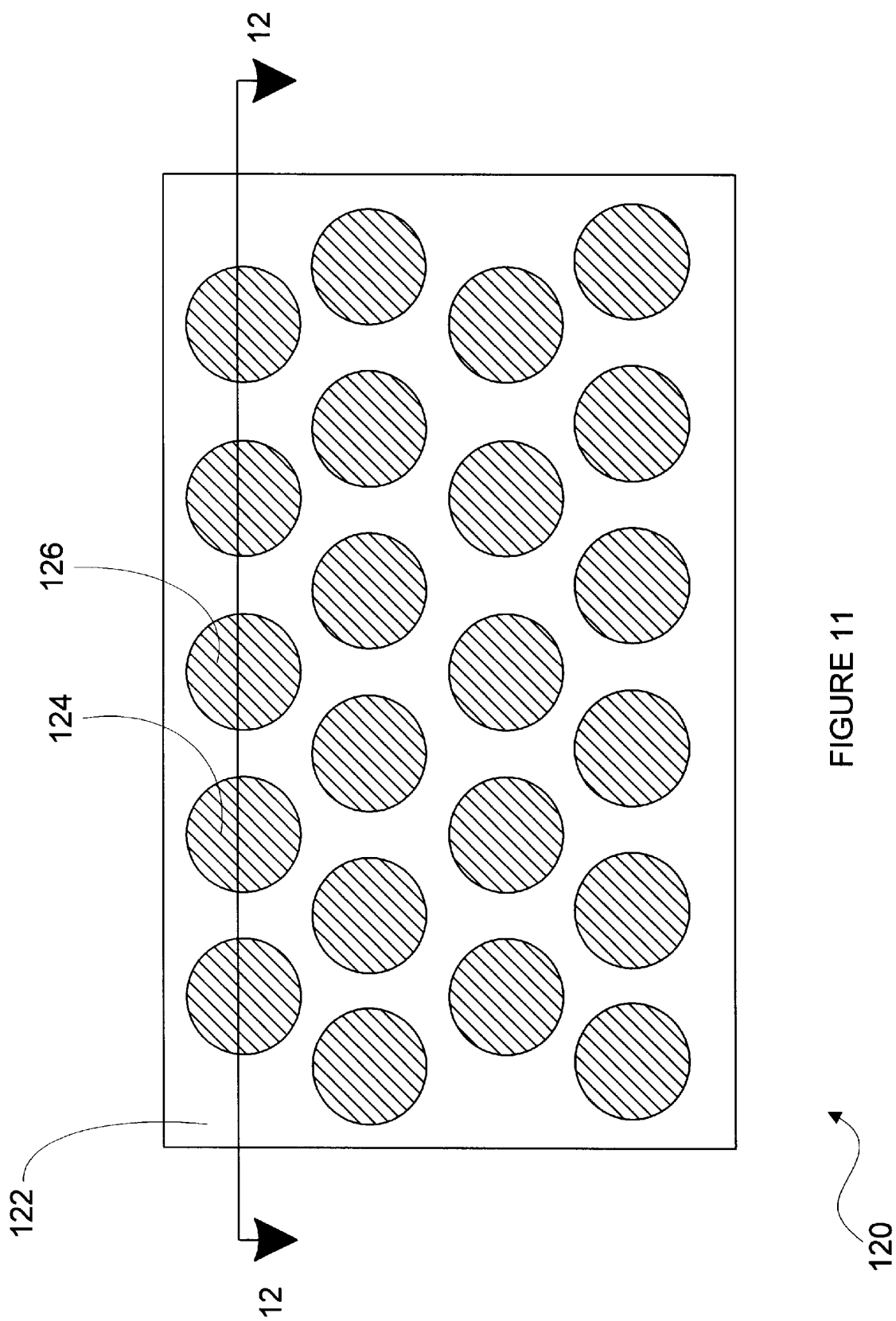
FIG. 11 shows a composite thermal interface pad in accordance with the present invention that includes resilient material and a series of non-resilient material portions, and is adapted for general use in a variety of applications.

FIG. 11 shows composite thermal interface pad 120, which illustrates another embodiment of the present invention. Pad 120 includes a template portion 122 and a series of pliable non-resilient material portions, such as 124 and 126. Pad 120 is a generic pad that may be used in variety of applications, since it is not tailored for any particular component or thermal pattern. Accordingly, pad 120 is ideally suited to be marketed as an all-purpose thermal interface pad. As with all embodiments of the present invention, the size of the cavities may be varied to alter stress combinations and vary the elastic limits of the composite thermal interface pad.

The present invention may be supplied with the template portion separated from the pliable non-resilient material, and pliable non-resilient material may be added to the template portion during final assembly. As discussed above, one of the largest problems with thermal grease is that the thermal grease tends to squeeze out from between the edges of an interface and make a mess. With the present invention, template portion 122 (without pliable non-resilient material in the cavities), may be applied to one plane of a thermal interface (such as a component or heat sink). The template portion may be a relatively thicker gap pad material or relatively thinner thermal tape. After the template portion is applied, a thin layer of pliable non-resilient material, such as thermal grease, may be manually or automatically dispensed into the cavities. After the other plane of the thermal interface (such as a heat sink or a component) is assembled into position, the two planes form a seal with template portion 122, thereby effectively sealing the pliable non-resilient material within the cavities. By sealing pliable non-resilient material within the cavities, the present invention also prevents the non-resilient material from drying out, which may be a problem with some compounds, such as thermal greases.

Figure 12:
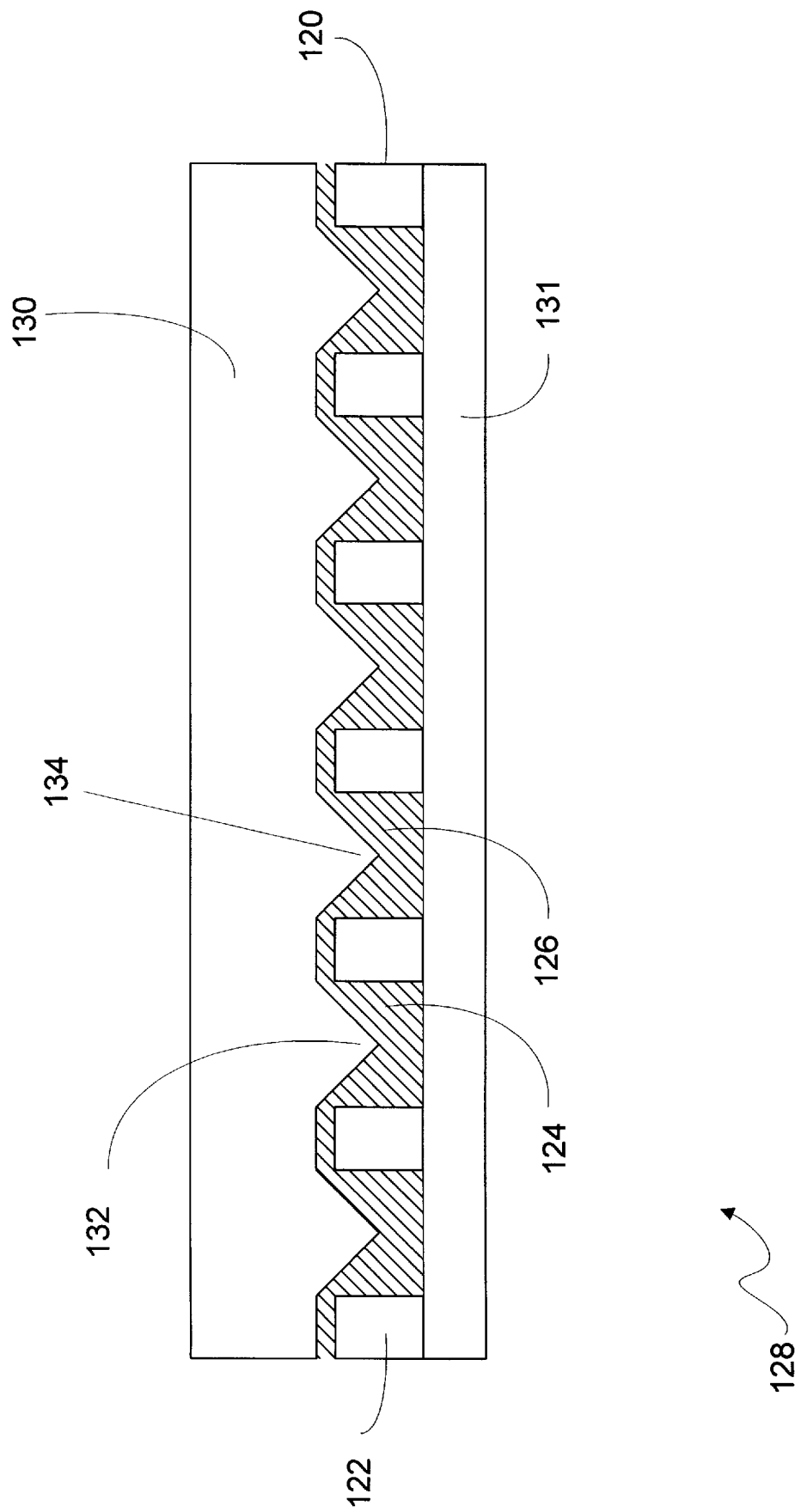
FIG. 12 includes a sectional view of the pad of FIG. 11 taken along line 12—12 of FIG. 11, as well as an electronic component and an adjacent structure having projection features.

FIG. 12 illustrates yet another embodiment of the present invention. FIG. 12 includes a sectional view of pad 120 taken along line 12—12 of FIG. 11, as well as adjacent structure 130 and electronic component 131. Adjacent structure 130 includes a projection feature, such as projection features 132 and 134, for each cavity that contains pliable non-resilient material. The projection features may be shaped like pyramids, hemispheres, or any other appropriate shape. The projection feature provides several advantages. First, it ensures a good thermal interface by "digging" into the pliable non-resilient material during assembly. Second, it decreases the thermal resistance of the thermal interface by increasing the surface area available for conducting heat in the areas filled with pliable non-resilient material, which are also the areas of the composite thermal interface pad best equipped to conduct heat. Finally, it minimizes the distances between the electronic component and the tips of the projection features. Note that projection features could also be provided on the electronic components.

Since pliable non-resilient materials, such as thermal greases and putties, have higher thermal conductivities than resilient materials, such as gap pads and thermal taps, the present invention provides a composite thermal interface pad that is better at conducting heat than gap pads and thermal tapes of comparable thicknesses. Like electrical conductivity, thermal conductivity is additive, so adding thermal conduction paths of higher thermal conductivity increases the total thermal conductivity of the thermal interface pad. Alternatively, for the reasons stated above the present invention can be adapted to provide a thick interface pad that has a thermal conductivity similar to thinner prior art pads. Providing a thick pad can alleviate problems caused by excessive stack-up tolerance.

Although the present invention has been primarily described herein with reference to common prior art thermal interface materials, such as gap pads, thermal tapes, thermal greases, thermal putties, and the like, the present invention may be formed from other materials. Of course, it is always desirable to use materials having high thermal conductivities. However, any material capable of imparting shape to a non-resilient and pliable material may be used by forming cavities therein. Likewise, any material that is pliable and non-resilient may be used to fill such cavities. For example, a composite compound formed from thermally conductive metallic micro-balls suspended in a thermally conductive paste would provide beneficial results. In addition, many prior art materials were electrically non-conductive because of the possibility that such materials could leach out from the interface and short out conductors on the PCB. Since the present invention contains pliable non-resilient material within a template that provides a seal between the component and the adjacent structure, it is possible to use pliable non-resilient materials that are electrically conductive without fear of causing shorts on the PCB. Since electrically conductive materials also tend to be excellent thermal conductors, the present invention allows the use of new classes of thermal interface materials that were previously not practical. Also, the same pliable non-resilient electrically conductive material may be used to provide a thermal interface and EMI containment, as discussed with reference to FIGS. 9 and 10.

Another class of materials that can be advantageously employed with the present invention are materials that are relatively solid at room temperature, and undergo a phase change and become viscous when heated. Such a material could be heated and poured into the template portion. After the material has cooled, the composite thermal interface pad can be easily manipulated and assembled into an electronic assembly. Alternatively, if the material is somewhat pliable at room temperature, it may be spread into the cavity. As described above, the template portion of the pad provides a good seal between the electronic component and the adjacent structure, such as a thermal can or a heat sink. Therefore, when the electronic component produces heat, the material in the cavity will become viscous, but will be contained within the cavity. The viscous nature of the material will cause it to flow into interstitial gaps. Also, the material will expand slightly when heated, further causing the material to flow into interstitial gaps and thereby forming an excellent thermal interface. Accordingly, such a material would be pliable and non-resilient when heated in a thermal interface, but may not have these characteristics during initial fabrication and assembly. Of course, those skilled in the art of thermal interfaces will recognize how to apply the teachings contained herein to combine a variety of materials to form the composite thermal interface pad of the present invention.

The present invention also provides a thermal interface that requires much less pressure to achieve desirable thermal properties. Using a prior art gap pad to provide a thermal interface between to a series of electronic components and a thermal can requires application of enough pressure to accommodate large stack-up tolerances and to fill interstitial air gaps. With the present invention, the pliable non-resilient material will fill the interstitial air gaps without requiring continuous application of significant pressure. Some pliable non-resilient material, such as thermal grease, will even tend to be better distributed into micro-gaps as the interface warms. In addition, the pliable non-resilient material is easily deformed to accommodate stack-up tolerances, and will not provide any unwanted forces because it will not tend to try to return to its original shape, as gap pad material does. In addition, if the template material is formed from a resilient conformable material, such as gap pad material, the template portion will impart a small amount of resiliency to the pliable non-resilient material, thereby maintaining a good thermal interface during thermal expansion and contraction cycles.

The present invention will allow more latitude in the application of thermal tapes and thermal pads. In the prior art, thermal tapes were thin because they were not especially good thermal conductors. By filling cavities within thermal tape with pliable non-resilient material, it is possible to make thermal tapes thick because the pliable non-resilient material will conduct much of the heat. Therefore, thermal tapes will be able to be used in environments requiring a thicker thermal tape, and still not require heat sink retaining spring clips. Likewise, in the prior art thermal pads had to be at least a minimum thickness to provide a certain amount of tolerance stack-up as an interface was compressed. With the present invention, that tolerance stack-up may be provided by the pliable non-resilient material, and the composite thermal interface pad of the present invention may be made thinner than prior-art thermal pads.

Although the present invention has been described with reference to preferred embodiments, workers skilled in the art will recognize that changes may be made in form and detail without departing from the spirit and scope of the invention.

What is claimed is:

1. An assembly comprising:
   a circuit board having a conductive surface capable of dissipating charge;
   a component that produces heat mounted on the circuit board;
   a thermally conductive adjacent structure for conducting heat produced by the component away from the component, the thermally conductive adjacent structure having a conductive surface capable of dissipating charge; and
   a composite thermal interface pad in thermal contact with the component and the thermally conductive adjacent structure, for conducting heat from the component to the thermally conductive adjacent structure, the composite thermal interface pad comprising:
   a template formed from a resilient material and having cavities formed therein, including a series of cavities formed proximate a perimeter of the template; and
   pliable non-resilient material provided within the cavities, wherein the pliable non-resilient material remains pliable and non-resilient when the composite thermal interface pad is conducting heat away from the component, and the pliable non-resilient material within the series of cavities proximate the perimeter of the template is electrically conductive and in electrical contact with the conductive surfaces of the component and the adjacent structure.

2. An assembly comprising:

a component that produces heat;

a thermally conductive adjacent structure that includes projection features, for conducting heat produced by the component away from the component; and a composite thermal interface pad in thermal contact with the component and the thermally conductive adjacent structure for conducting heat from the component to the thermally conductive adjacent structure, the composite thermal interface pad comprising:

a template formed from a resilient material and having one or more cavities formed therein; and a pliable non-resilient material provided within one or more of the cavities, wherein the pliable non-resilient material remains pliable and non-resilient when the composite thermal interface pad is conducting heat away from the component and the projection features of the thermally conductive adjacent structure extend into the pliable non-resilient material.

3. An assembly comprising:

a component that produces heat and includes projection features;

a thermally conductive adjacent structure for conducting heat produced by the component away from the component; and a composite thermal interface pad in thermal contact with the component and the thermally conductive adjacent structure for conducting heat from the component to the thermally conductive adjacent structure the composite thermal interface pad comprising:

a template formed from a resilient material and having one or more cavities formed therein; and a pliable non-resilient material provided within one or more of the cavities, wherein the pliable non-resilient material remains pliable and non-resilient when the composite thermal interface pad is conducting heat away from the component and the projection features of the component extend into the pliable non-resilient material.

\* \* \* \* \*